United States Patent [19]

Montagu

[11] 4,186,332
[45] Jan. 29, 1980

[54] LIMITED ROTATION MOVING IRON MOTOR WITH NOVEL VELOCITY SENSING AND FEEDBACK

[75] Inventor: Jean I. Montagu, Brookline, Mass.

[73] Assignee: General Scanning Inc., Watertown, Mass.

[21] Appl. No.: 908,400

[22] Filed: May 22, 1978

[51] Int. Cl.$^2$ ............................................ H02K 33/00
[52] U.S. Cl. .................................... 318/128; 318/132; 335/229; 335/230; 310/29; 310/36
[58] Field of Search ........................ 318/127, 128, 132; 310/36–39, 229, 230, 272, 276; 350/6

[56] References Cited

U.S. PATENT DOCUMENTS

| | | | |
|---|---|---|---|
| Re. 26,749 | 1/1970 | Montagu | 335/229 |
| 3,149,274 | 9/1964 | Hetzel | 318/128 |
| 3,610,973 | 10/1971 | Bauer | 310/15 |
| 3,624,574 | 11/1971 | Montagu | 335/230 |
| 3,959,673 | 5/1976 | Montagu | 310/38 |
| 3,970,979 | 7/1976 | Montagu | 335/229 |
| 4,076,998 | 2/1978 | Montagu | 318/132 |
| 4,090,112 | 5/1978 | Selverstone | 318/128 |
| 4,135,119 | 1/1979 | Brosens | 318/128 |

*Primary Examiner*—Donovan F. Duggan

[57] ABSTRACT

A device for providing a voltage indicating the angular velocity of rotation of the armature in a limited rotation, polarized, moving iron galvanometer. The device includes a means for providing a first voltage dependent upon the angular velocity of the armature, the self-inductance of the galvanometer drive coil, and the drive current in the drive coil. A compensation coil is magnetically coupled to the drive coil and magnetically isolated from the effects of the rotating armature to provide a second voltage which is dependent upon mutual inductance between the drive and compensation coils and upon the drive current, but is not dependent upon the effects of the rotating armature due to the magnetic isolation of the compensation coil from the armature. A combining means proportionally combines the first and second voltages to provide a voltage indicating the angular velocity of rotation of the armature. The means for providing the first voltage includes either the drive coil, with the first voltage appearing across the drive coil, or a pickoff coil wound coaxially with and adjacent to the drive coil so that the first voltage appears across the pickoff coil and is proportional to the voltage appearing across the drive coil. The velocity signal thus derived is introduced to the drive circuit to provide effective damping.

11 Claims, 4 Drawing Figures

LIMITED ROTATION MOVING IRON MOTOR WITH NOVEL VELOCITY SENSING AND FEEDBACK

BACKGROUND OF THE INVENTION

This invention relates to limited motion, polarized, moving iron motors, e.g., galvanometers used in strip chart recording of biological function measurements.

There is a general requirement to obtain the maximum frequency and amplitude response possible with such motors while avoiding excessive overshoot. This requires damping the response of the motor in such a way that the motor operates as a second order system. I.e., the equation of motion of the motor is of the form, e.g., in a galvanometer, $$I(d^2\theta/dt^2) + K\theta = F;$$

where I is the inertial load of the galvanometer armature and writing stylus, $\theta$ is the angle of rotation of the armature, K is a torsional restorative force acting to return the armature to a neutral position, and F is a torsional force applied to rotate the armature from the neutral position. F is due to a flow of current through the galvanometer drive coils where the magnitude and direction of the current determines value and direction of $\theta$.

One approach to controlling the galvanometer response is active velocity feedback, wherein a signal representing the angular velocity of rotation of the armature ($d\theta/dt$) is fed back and combined with an input signal representing the desired value of $\theta$. The generally preferred method of obtaining the velocity signal, for reasons of size and complexity of construction, has been by means of a velocity coil, preferably wound on the drive coil. For this purpose the permanent magnet which is included in the glavanometer stator structure to provide a bias flux to exert the restorative torsional force on the armature as described above, also plays a role in providing the velocity signal. The bias flux is modulated by the rotation of the armature in a manner related to $d\theta/dt$ and the velocity pickoff coil senses the variations in the bias flux to provide the velocity signal. In practice, however, the drive coil and the velocity pickoff coil are magnetically linked by a mutual inductance so that the desired velocity signal is buried in a large signal which is induced in the velocity pickoff coil by the drive current flowing in the drive coil. The coupling effects increase with the second power of the frequency of the drive current and became especially detrimental above the resonant frequency of the galvanometer system, when the induced drive currents change phase relative to the velocity signal. The common solution to this problem has been to locate the velocity pickoff coil at a substantial distance from the drive coil, but this results in increased weight, loss of structural rigidity, and increased cost and complexity. Another solution, as shown in Montagu U.S. Pat. No. 3,970,979, is to use a non-symmetric stator and drive coil structure arranged so that the velocity and drive coil magnetic circuits are separated with each including a separate portion of the armature and bias flux magnetic circuit.

SUMMARY OF THE INVENTION

The present invention provides a novel means for sensing the angular velocity of rotation of an armature in a limited rotation polarized electromagnetic motor of the type having a rotatable armature of ferromagnetic material mounted for rotation about an axis, and restrained with a resilient means such as a spring or torsion bar, a stator adjacent to the armature, a stationary permanent magnet, and a driving coil through which a driving current flows. The stator, permanent magnet, armature, and drive coil are arranged to apply permanent magnetic biasing flux and a magnetic flux produced by the drive coil to engender a torque and therefore to rotationally displace the armature from the neutral position by an amount and direction dependent upon the amount and direction of the flow of drive current through the drive coil and the stiffness of the spring restraining means. A means is arranged to provide a first voltage that is dependent upon the angular velocity of rotation of the armature, the drive current and the self-inductance of the drive coil. A compensation coil is arranged to have a magnetic circuit coupled to the drive coil and isolated from the effects of the rotating armature to provide a second voltage, appearing across the compensation coil, that is dependent upon mutual inductance between the device and compensation coils and upon the drive current but not dependent upon the angular velocity of rotation of the armature. Means are provided for proportionally combining the first and second voltages to provide a voltage indicating the angular velocity of the armature.

In a first embodiment, the means providing the first voltage includes the drive coil and the first voltage appears across the drive coil. In another embodiment, the means providing the first voltage includes a pickoff coil wound on top of the drive coil, with the first voltage appearing across the pickoff coil and being induced by the current through the drive coil. The compensation coil, in the preferred embodiment, is located adjacent to the drive coil on the side of the drive coil away from the armature and, in another embodiment, it is located adjacent the drive coil at one longitudinal end of the motor. In both embodiments, the compensation coil is arranged so as to be shielded from the effects of the rotating armature by the drive coil and the stator structure. In one embodiment, an electronic circuit is used to combine the first and second voltages and, in an embodiment having a pickoff separate from the drive coil, the pickoff and compensation coils are connected in series to proportionally combine the first and second voltages. Other important features are taught in the following description.

DESCRIPTION OF THE EMBODIMENT

Drawings

Description

Figure 1:
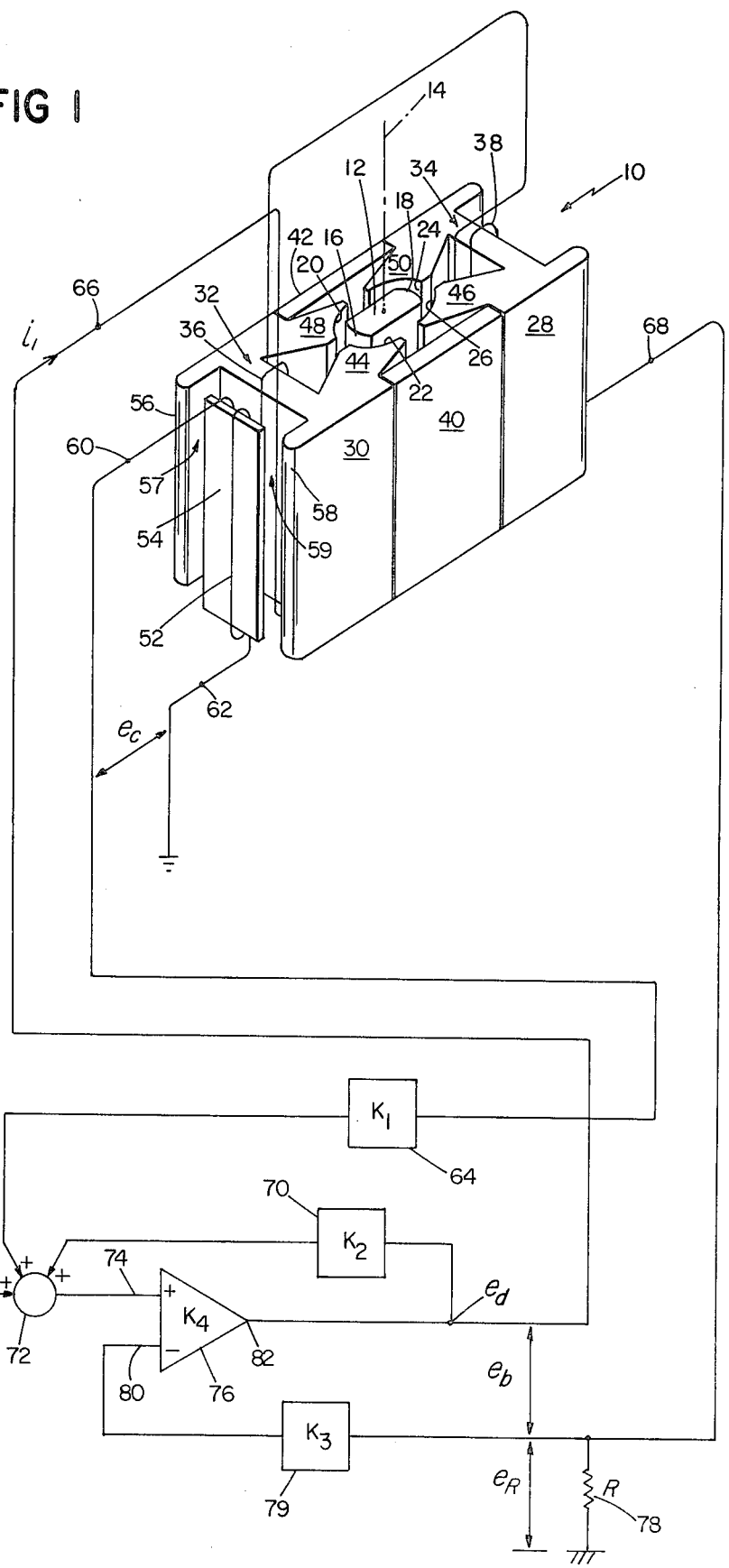
FIG. 1 is a perspective view of a limited rotation moving iron galvanometer and a block diagram of a galvanometer control circuit.

Referring to FIG. 1, galvanometer 10 has elongated ferromagnetic armature 12 mounted to rotate through a limited arc about longitudinal axis 14. Oppositely directed cylindrical pole faces 16, 18 of the armature interact with cylindrical stator pole face pairs 20, 22 and 24, 26 of stator structures 28, 30. Each of the stator structures is made of a stack of identical ferromagnetic laminations defining elongated core portions 32, 34, about which are wound drive coils 36, 38. Permanent magnets 40, 42 provide a bias flux, through the magnetic circuits consisting, respectively, of flux arms 44, 46 and the armature and arms 48, 50 and the armature. The armature is restrained by elastic means such as a torsion bar spring, not shown, and is preferably at rest in a symmetrical position with respect to pole faces 16, 18, 20, 22, 24 and 26. The bias flux is modulated by the moving armature in a way related to the velocity of rotation of the armature and induces a related voltage across drive coils 36, 38. Current $i_1$ flowing in the drive coils provides a drive flux through the magnetic circuits consisting, respectively, of the coils, flux arms 44, 48 and 46, 50 and the armature. The drive flux exerts a torsional force acting against the restorative torsional force provided by the spring (not shown), to rotate the armature from its initial position. The armature comes to rest at a position where the opposing forces are equal.

Compensation coil 52 is wound on ferromagnetic plate 54 and located between ear portions 56, 58 of core portion 32 with air gaps 57, 59 between the edges of plate 54 and the ears. An induced voltage, $e_c$, will appear between terminals 60 and 62 of the coil due to drive current $i_1$ flowing through coil 36.

$e_c$ is multiplied by a factor $k_1$ by multiplier 64 and $e_d$, the voltage between terminal 66 of the drive coils and ground, is multiplied by a factor $k_2$ by multiplier 70. $e_d$ is the sum of the voltage $e_b$ appearing across terminals 66 and 68 of the drive coil and the voltage $e_R$ appearing between terminal 68 and ground due to $i_1$ flowing through resistor 78. The voltages $k_1 e_c$ and $k_2 e_d$ are added to $e_s$, a voltage representing the desired armature position, in summing point 72 and the resulting voltage, $e_s + k_1 e_c + k_2 e_d$, is applied to input 74 of driver amplifier 76. $e_R$ is multiplied by $k_3$ by multiplier 79 and applied to input 80 of the driver amplifier, where it is subtracted from the voltage applied to input 74. Output 82 of the amplifier is connected to terminal 66 of the drive coils to provide drive current $i_1$, so that $e_d$ can be expressed as $$e_d = k_4[e_s + (k_1 e_c + k_2 e_d - k_3 e_R)] \quad (1)$$

where $k_4$ is the gain of amplifier 76. The term $$e_f = k_1 e_c + k_2 e_d - k_3 e_R \quad (2)$$

where $e_f$ is a feedback signal used to damp the galvanometer response and which, in a classic second order system, must be a substantially pure velocity signal (i.e., a signal relating to $d\theta/dt$ where $\theta$ is the angular position of the rotor).

$e_d$ is a function of $\theta$ and $i_1$, $$e_d = (R + r)i_1 + L_d(di_1/dt) + M(di_2/dt) + BDNd(d\theta/dt) \quad (3)$$

where R is the value of resistor 78, r is the resistance of the drive coils, $L_d$ is the self-inductance of the drive coil, M is the mutual inductance between the drive and compensation coils, and $i_2$ is the current flowing in the compensation coil. The magnetic circuit of the drive coils contains the armature, so that the geometry of the magnetic path, and therefore the self-inductance $L_d$ of the drive coils, are dependent upon the angular position of the armature. The $e_d$ term in the feedback signal therefore contains the desired velocity signal component $d\theta/dt$ but also contains unwanted components of $i_1$, $di_1/dt$, $di_2/dt$, and $\theta$. In accordance with the invention, output 82 of amplifier 76 and the input of multiplier 70 present high impedances to the drive coil, so that changes in $e_d$ due to $d\theta/dt$ have little effect on the value of $i_1$.

The compensation coil and plate 54 are located to be loosely coupled to the magnetic circuit of drive coil 36, with the compensation coil magnetic circuit consisting of plate 54, ear portions 56, 58, core portion 32 and drive coil 36. Because of the high reluctance provided, in accordance with the invention, by air gaps 57, 59 as compared to the low reluctance provided by core portion 32, the compensation coil magnetic circuit does not, except for leakage path effects, include flux from the armature and permanent magnets. The self-inductance of the compensation coil is therefore constant, and the modulated flux in the armature circuit does not directly induce a $d\theta/dt$ component in $e_c$. Likewise, because the $d\theta/dt$ component in $e_d$ has little effect on $i_1$, there will not be a $d\theta/dt$ component induced in $e_c$ indirectly through the drive coil.

$e_c$ therefore can be expressed as $$e_c = L_c(di_2/dt) + M(di_1/dt) \quad (4)$$

where $L_c$ is the self-inductance of the compensation coil and $i_2$ is the induced current flowing in the coil. In accordance with the invention by providing multiplier 64 as a high input impedance circuit, $i_2 \approx 0$, so that $e_c$ can be expressed as $$e_c = M(di_1/dt) \quad (5)$$

and the $M(di_2/dt)$ term in equation (3) drops out as negligible. M, which appears in equations 3, 4 and 5, is determined by the geometry of the mutual magnetic circuit between the compensation coil and drive coil 36. This geometry is very complex but, in practice, M is found to be proportional to $L_d$ and $L_d$ is found to vary over a range of 30% (rather than the 100% predicted in theory) when the position of armature 12 varies from the symmetrical position to an extreme deflected position.

For the above reasons, the $e_c$ term in the feedback signal therefore, in accordance with the invention, has no significant velocity component and the only substantial component of this signal is proportional to $L_d(di_1/dt)$.

Substituting $e_d$ and $e_c$ from equations (3) and (5) and $e_R = i_1 R$, where R is the value of resistor 78, into equation (2) gives $$\begin{aligned} e_f &= k_1 \left[ M \frac{di_1}{dt} \right] + k_2 \left[ R + r \right) i_1 + \\ & \quad L_d \frac{di_1}{dt} + BDNd \frac{d\theta}{dt} \right] - k_3[i_1 R] \\ &= k_2 BDNd \frac{d\theta}{dt} + [k_2 L_d + k_1 M] \frac{di_1}{dt} + \\ & \quad [k_2 (R + r) - k_3 R] i_1 \end{aligned} \quad (6)$$

Since, as stated above, M is proportional to $L_d$, $k_1$ and $k_2$ are selected to substantially reduce the $di_1/dt$ term to zero and $k_3$ is selected to similarly control the magnitude of the $i_1$ term, so that $$e_f \approx k_2 BDN d(d\theta/dt) \quad (7)$$

which is the desired velocity signal. It is particularly important to be able to reduce the $di_1/dt$ component of the feedback signal to zero because, while errors due to the $i_1$ component may be acceptable, the $di_1/dt$ term, especially at high frequencies and for large values of $i_1$, can cause unacceptable errors if fed back and amplified.

Figure 2:
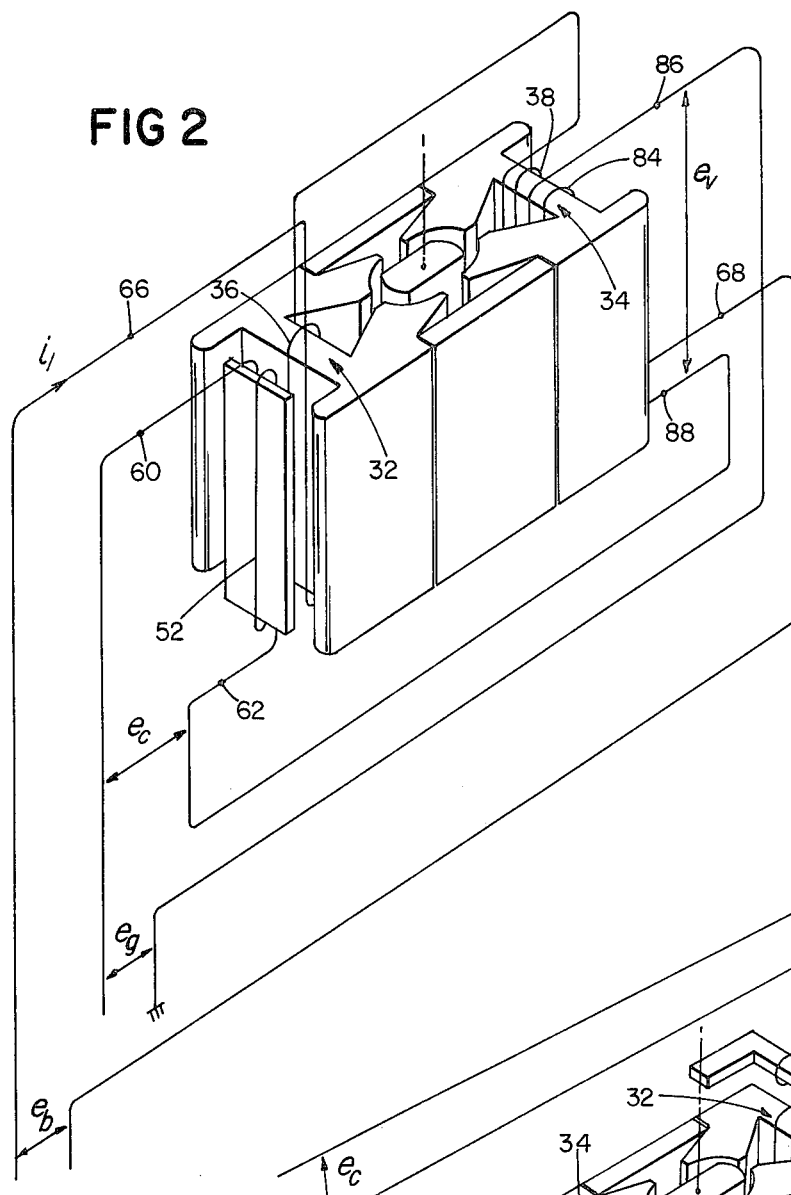
FIG. 2 shows an alternate embodiment of the invention.

FIG. 2 shows an alternate embodiment of the invention. Pickoff coil 84 is wound on core portion 34 over drive coil 38, so that the voltage $e_v$ appearing across terminals 86, 88 of the velocity coil is induced by and proportional to the voltage $e_b$ appearing across the drive coil. $e_v$ will therefore contain a component dependent upon $\theta$, $i_1$, and $di_1/dt$ and, because coil 84 contains part of the bias flux magnetic circuit, will have a component dependent upon velocity $(d\theta/dt)$. The velocity and compensation coils are connected in series so that $e_v$ and $e_c$ subtract and the $e_c$ component dependent upon $i_1$, $di_1/dt$ and $\theta$ cancels the corresponding components in $e_v$. The voltage $e_g$ which appears between terminal 60 of the compensation coil and terminal 86 of the velocity coil thereby contains only a $d\theta/dt$ component and is a substantially pure velocity signal. $e_v$ is then fed back and added to $e_s$, to damp the galvanometer response, in place of the $k_2e_d$ and $k_1e_c$ signals used in the embodiment of FIG. 1.

Figure 3:
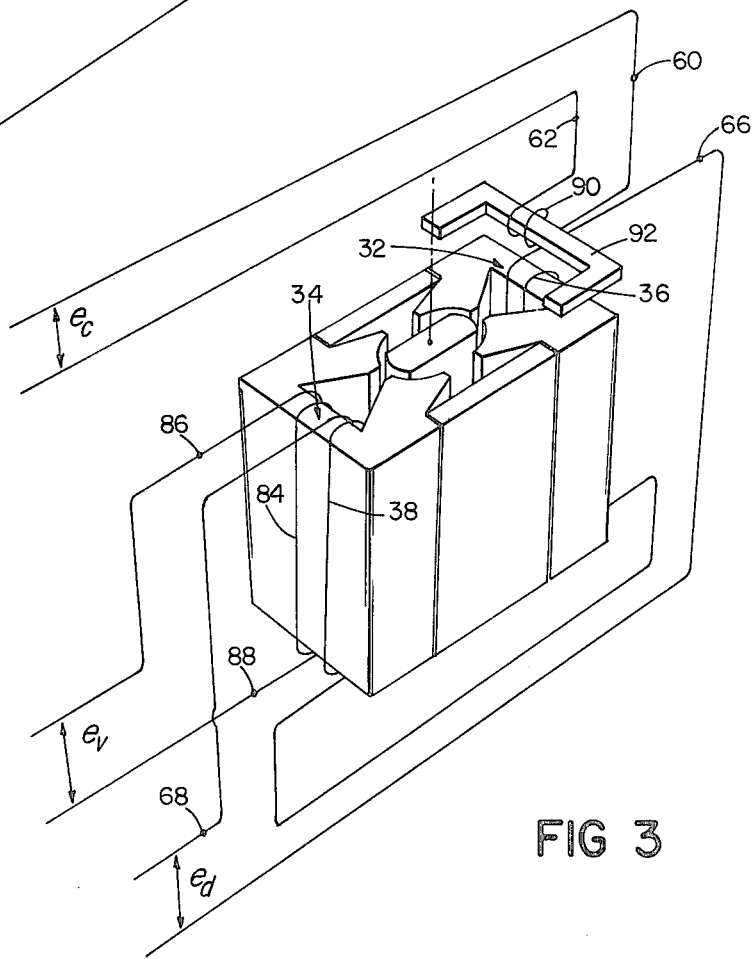
FIG. 3 shows an alternate embodiment of the compensation coil.

FIG. 3 shows an alternate embodiment of the compensation coil wherein compensation coil 90 is wound on U-shaped core plate 92. Plate 92 is made from a flat plate of ferromagnetic material and is located above and adjacent to the upper surface of core portion 32 and drive coil 35. The horizontal dimensions of core plate 90 correspond to the cross section of core portion 32. Coil 90 and core plate 92 are arranged, like coil 52 and plate 54, so that the magnetic circuit of coil 90 is loosely coupled to that of drive coil 36.

In another alternate embodiment, not shown, core portions 32, 34 are constructed without ear portions 56, 58 and plate 52 has ear portions on its vertical edges extending towards core portion 32, so that the plate has a U-shaped cross-section. Furthermore, it is sometimes necessary to shield the coils, particularly the compensation coils, from stray RF fields, e.g., those generated by an electric motor. Galvanometer 10 then further includes a shield made, e.g., from Mu metal. The shield comprises a plate-like body, the height and width of the vertical end of core portion 32, located closely adjacent to and covering coils 52 and 36, with two ear portions on its vertical edges extending closely along the side of core portion 32 towards magnets 40 and 42.

Figure 4:
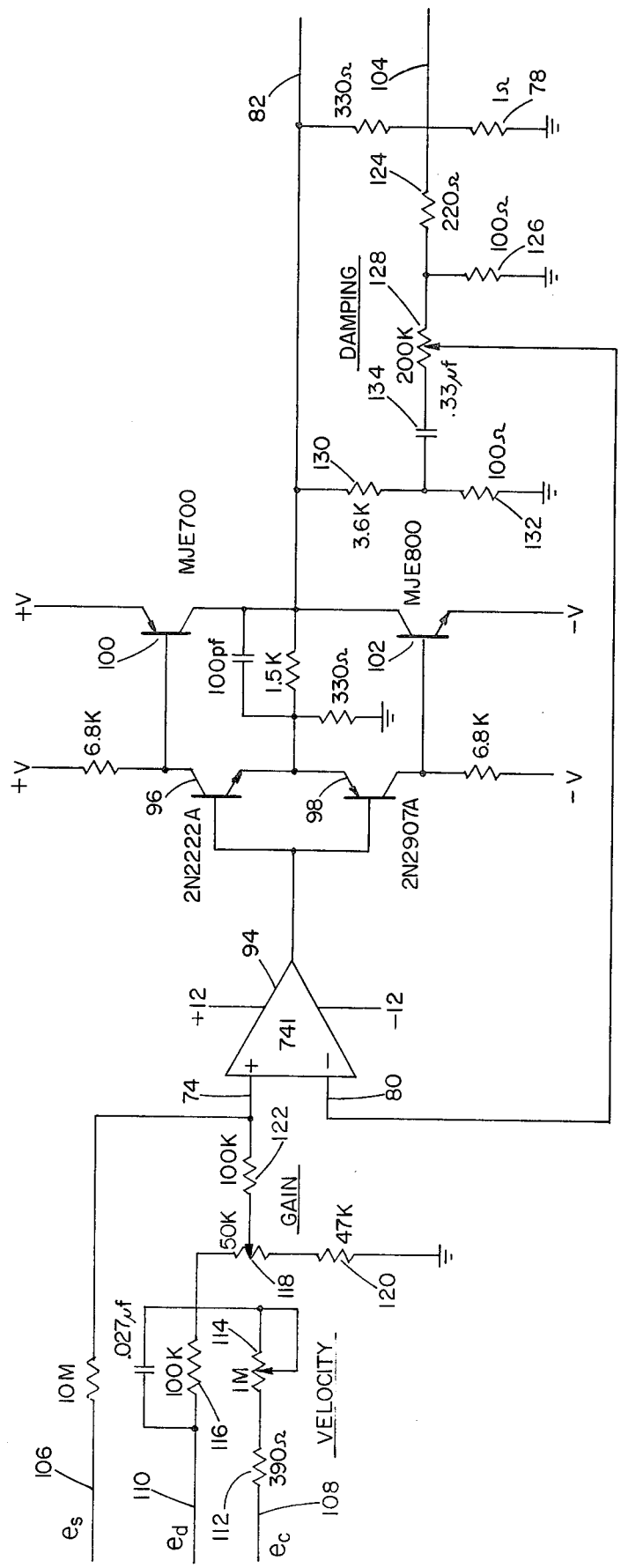
FIG. 4 is a schematic diagram of the galvanometer control circuit.

FIG. 4 shows a circuit used with the embodiments of FIG. 1, 2, or 3 to control galvanometer 10. Driver amplifier 76 comprises operational amplifier 94 and transistors 96, 98, 100, and 102, which together comprise a push-pull driver circuit. Output 82 is connected to terminal 66 of the drive coils and terminal 104 is connected to terminal 68 of the drive coils. In the embodiment of FIG. 1, $e_s$ is applied to input 106, terminal 60 of the compensation coil is connected to input 108, and output 82 is connected to input 110. Multiplier 64 comprises resistors 112 and 114, which provides an input impedance of up to 1 Mohms to the compensation coil, and multiplier 70 is resistor 116, which provides an input impendance of 100 Kohms to the drive coil. Multipliers 64 and 70 are connected to summing point 72, which comprises resistors 118, 120, and 122. $k_1$ is determined by resistor 114 and $k_2$ by resistor 116, which is fixed, while resistor 118 determines the gain of amplifier 76. Resistor 78 is connected between terminal 104 and ground with multiplier 79 comprising resistors 124, 126, and 128; resistor 128 determines $k_3$ and controls the degree of damping applied to the galvanometer response. A portion of $e_d$ is fed back to input 80 of amplifier 76, through resistors 130, 132, and 128, and capacitor 134, to compensate for variations in $e_d$ due to temperature effects in amplifier 76. In the embodiments of FIGS. 2 and 3, terminal 60 of the compensation coil (i.e., $e_g$) is connected to input 108 and input 110 is grounded with output 82 connected to terminal 66 of the drive coils. All resistor and capacitor values and voltages are given in FIG. 4 and all resistors are $\frac{1}{4}$ watt 5% resistors unless otherwise noted. Operational amplifier 94 is a UA741 as from Texas Instruments or Sylvania, transistor 96 is a 2N2222A, transistor 98 is a 2N2907A, and transistor 100 and 102, respectively, are MJE700 and MJE800 from Motorola.

In the embodiments of FIGS. 1, 2, and 3, the axial length of the armature and stator structures are 1 inch and the armature diameter is $\frac{1}{2}$ inch. The gap between pole faces 16, 18 of the armature and stator pole faces 20, 22, 24 and 26 is 0.004 inch. Plate 54 is 0.010 to 0.025 inch thick and made of iron, and the gap between the vertical edges of plate 54 and ear portions 56, 58 is 0.050 inch. If core portions 32, 34 and plate 54 are constructed with the ear portions on plate 65, the gap between the ear portions and the core portions is also 0.050 inch. Plate 54 is made of iron and the compensation coil has 150 turns which has resistance of 44 ohms. There are 15 turns in the velocity coil, which has a resistance of 0.5 ohms, and each of the two drive coils has 425 turns with a combined series resistance of 25 ohms.

I claim:
1. In combination, a limited rotation moving iron electromagnetic motor and a device for providing a voltage indicating the angular velocity of rotation of the armature of said motor, said motor comprising a rotatable armature of ferromagnetic material mounted for rotation about an axis, a stator adjacent to said armature, a stationary permanent magnet, and a stationary drive coil through which a drive current flows, and means for elastic angular restraint attached to said armature wherein said stator, magnet, armature, and drive coil are arranged to apply permanent magnet biasing flux and to apply magnetic flux produced by said drive current to rotate said armature from said neutral position in an amount and direction dependent upon the flow of said drive current and the stiffness of said elastic restraint, said device comprising:
means for providing a first voltage dependent upon said angular velocity of said armature, the self-inductance of said drive coil, and said drive current,
a compensation coil magnetically coupled through a gap to said drive coil and magnetically isolated from the effects of said rotating armature to provide a second voltage,
said second voltage appearing across said compensation coil and being dependent upon mutual inductance between said compensation coil and said drive coil and upon said drive current,
said second voltage being substantially unaffected by angular velocity of rotation of said armature due to said magnetic isolation of said compensation coil from the effects of said rotating armature, and combining means for proportionally combining said first and second voltages to provide said voltage indicating said angular velocity of rotation.

2. The apparatus of claim 1 wherein said compensation coil is incorporated in a circuit of high impedance to cause the current in said compensation coil to be nearly zero whereby said mutual inductance between said compensation coil and said drive coil is closely proportional to said self inductance of said drive coil.

3. The apparatus of claim 1 wherein said voltage indicating said angular velocity of rotation is combined with a signal controlling said drive current in a manner to provide damping.

4. The apparatus of claim 1 wherein said means for providing said first voltage includes connections to obtain said first voltage from across said drive coil.

5. The apparatus of claim 1 wherein said means for providing said first voltage includes a pickoff coil wound coaxially with and adjacent to said drive coil, said first voltage comprising a voltage appearing across said pickoff coil and being proportional to the voltage appearing across said drive coil.

6. The apparatus of claim 1 further comprising a resistance connected in series with said drive coil to provide a third voltage directly dependent upon said drive current, said third voltage being proportionally combined with said first and second voltages.

7. The apparatus of claims 1, 4 or 5 wherein said combining means includes a resistance network for proportionally combining said second voltage with said first voltage.

8. The apparatus of claim 6 wherein said combining means comprises circuitry for proportionally combining said second and third voltages with said first voltage.

9. The apparatus of claim 5 wherein said combining means includes a series connection of said pickoff coil and said compensation coil arranged so that said second voltage across said compensation coil is proportionally combined with said first voltage across said pickoff coil.

10. The apparatus of one of claims 1, 2, 3, 4, 5, 6, 8 or 9 wherein
said stator is located adjacent to said armature and extends lengthwise of said armature along said axis of rotation of said armature,
said permanent magnet extends lengthwise of said stator,
said drive coil is wound on said stator extending lengthwise of said stator with the axis of said drive coil generally perpendicular to said axis of rotation, and
said compensation coil is wound on a core separate from said stator, said compensation coil and core extending lengthwise of said drive coil and located adjacent to said drive coil on the side of said drive coil opposite said armature, with the axis of said compensation coil generally parallel to said drive coil axis,
so that said drive coil and said stator magnetically isolate said compensation coil from the effects of said rotating armature.

11. The apparatus of one of claims 1-6, 8 or 9 wherein
said stator is located adjacent to said armature and extends lengthwise of said armature along said axis of rotation of said armature,
said permanent magnet extends lengthwise of said stator,
said drive coil is wound on said stator extending lengthwise of said stator with the axis of said drive coil generally perpendicular to said axis of rotation,
said compensation coil is wound on a core separate from said stator, said compensation coil and core being located closely adjacent to said drive coil at a longitudinal end of said stator,
so that said drive coil and said stator magnetically isolate said compensation coil from the effects of said rotating armature.

* * * * *